(12) United States Patent
Jao

(10) Patent No.: US 7,486,085 B2
(45) Date of Patent: Feb. 3, 2009

(54) CALIBRATION CIRCUIT FOR RESISTANCE COMPONENT

(75) Inventor: Che Yuan Jao, Hsinchu (TW)

(73) Assignee: MediaTek Inc. (TW)

( * ) Notice: Subject to any disclaimer, the term of this patent is extended or adjusted under 35 U.S.C. 154(b) by 103 days.

(21) Appl. No.: 11/698,517

(22) Filed: Jan. 25, 2007

(65) Prior Publication Data

US 2008/0079441 A1   Apr. 3, 2008

(51) Int. Cl.
   *G01R 35/00*   (2006.01)
   *H03K 17/16*   (2006.01)
   *G01P 21/00*   (2006.01)

(52) U.S. Cl. .......................... 324/601; 326/30; 702/85; 702/90

(58) Field of Classification Search ........................ None
    See application file for complete search history.

(56) References Cited

U.S. PATENT DOCUMENTS 5,926,031 A * 7/1999 Wallace et al. ................ 326/30
6,064,224 A * 5/2000 Esch et al. ..................... 326/30
6,157,206 A * 12/2000 Taylor et al. .................. 326/30
7,193,431 B2 * 3/2007 Miyake et al. ................ 326/30
7,408,378 B2 * 8/2008 Best et al. ..................... 326/30

* cited by examiner

*Primary Examiner*—Diego Gutierrez
*Assistant Examiner*—Jeff Natalini
(74) *Attorney, Agent, or Firm*—Andrew D. Fortney

(57) ABSTRACT

A calibration circuit including a plurality of first resistance components, a plurality of second resistance components, and a first feedback system is provided. The first feedback system selects $M_1$ first resistance components and $N_1$ second resistance components so that a first combination of the $M_1$ first resistance components and the $N_1$ second resistance components substantially matches the impedance of a first resistor. The first feedback system selects $M_2$ first resistance components and $N_2$ second resistance components so that a second combination of the $M_2$ first resistance components and the $N_2$ second resistance components substantially matches the impedance of the first resistor. Based on the values of $M_1$, $N_1$, $M_2$, $N_2$, and a target impedance, the first feedback system generates a first set of calibration signals for a plurality of third resistance components and generates a second set of calibration signals for a plurality of fourth resistance components.

21 Claims, 5 Drawing Sheets

Pull-up Resistor

Pull-down Resistor

US 7,486,085 B2

CALIBRATION CIRCUIT FOR RESISTANCE COMPONENT

BACKGROUND OF THE INVENTION

1. Field of the Invention

This invention relates generally to high speed transceivers. More particularly, it relates to circuits for calibrating termination resistances of high speed transceivers.

2. Description of the Prior Art

Preventing signal reflections on transmission lines is an important issue when designing high speed transceivers. To achieve impedance matching and reduce signal reflections, it is necessary to set the output/input impedances of a transceiver substantially equal to the characteristic impedance of the transmission line connected to the transceiver. More specifically, the output impedance of the transceiver must be equal to the characteristic impedance of the transmission line when the transceiver operates as a transmitter; the termination impedance of the transceiver must be equal to the characteristic impedance of the transmission line when the transceiver operates as a receiver.

In IC chips, almost all resistances consisting of transistors or resistors vary with processes, operating voltages, and temperatures either slightly or seriously. When the output/input impedances of a transceiver have variations due to aforementioned factors, impedance mismatches occur. For this reason, calibrations for on-die impedances are needed.

Please refer to FIG. 1, which illustrates a calibration circuit proposed in the patent U.S. Pat. No. 6,157,206. In this case, a portion of an integrated circuit 100 is shown. A reference termination device 106 is coupled to a node 110. A resistor 120 is coupled, between node 110 and ground. The resistor 120 is typically a precision resistor (e.g., +/−1%) external to the integrated circuit 100. The reference termination device 106 is configured in series with the resistor 120 to form a voltage divider. A comparator 104 has two input terminals and an output terminal. A first input terminal of the comparator 104 is coupled to node 110, and a second input terminal of the comparator 104 is coupled to a reference voltage source ($V_{REF}$). In this way, the voltage at node 110 is compared to $V_{REF}$, which can be substantially set as one half a power supply voltage of the integrated circuit 100. A controller 102 is coupled to the output terminal of comparator 104. Based on the output of the comparator 104, the controller 102 adjusts the reference termination device 106. If the output of the comparator 104 indicates that the voltage at node 110 is higher than $V_{REF}$, then the controller 102 generates an output that causes the impedance of reference termination device 106 to increase. On the contrary, if the output of the comparator 104 indicates that the voltage at node 110 is lower than $V_{REF}$, then the controller 102 generates an output that causes the impedance of reference termination device 106 to decrease. By this feedback mechanism, the reference termination device 106 is adjusted to substantially match the external resistor 120:

A controlled termination device 108 is nominally the same as the reference termination device 106 and functions as the termination resistance of an input buffer 112. After the aforementioned feedback loop is stable, the control signal provided from the controller 102 to the reference termination device 106 can be transmitted to the controlled termination device 108. Since the two termination devices 106 and 108 are nominally the same, the controlled termination device 108 also nearly matches the external resistor 120 after being adjusted with the control signal. The controlled termination device 108 is accordingly calibrated. Typically, this calibration process is continuous and transparent to normal chip operation, for example, the operation of the input buffer 112.

The calibration process illustrated in FIG. 1 can also be used to calibrate a output driving impedance consisting of both pull-up transistors and pull-down transistors. Since pull-up and pull-down transistors generally have different conductance and are sized differently, they require two different sets of calibration signals: one for the pull-up transistors and the other for the pull-down transistors.

Furthermore, every section on a chip may require different impedance. Hence, two external resistors and two calibration pins are needed for each section that requires specific impedance. For example, one chip including a transmitter and a receiver needs four calibration pins and four external resistors according to the calibration process illustrated in FIG. 1. In prior arts, for an IC chip that has plural transceivers and/or that must be automatically calibrated against process, voltage and temperature variations, a large number of pins and silicon area are consumed to meet good signal quality. This increases the cost of the chip and the assembly cost of any board on which the chip is used.

Obviously, there is a need in the art for a way to reduce the number of calibration pins and external resistors required. There is also a need to reduce consumed silicon area for calibrating output/input impedances of transceivers while sustaining good high-speed signal quality.

SUMMARY OF THE INVENTION

To solve the aforementioned problem, this invention provides calibration circuits and calibration methods for resistance components. According to this invention, only one calibration pin and one external resistor are needed for all the transceivers in an integrated circuit.

One preferred embodiment according to this invention is a calibration circuit including a plurality of first resistance components, a plurality of second resistance components, and a first feedback system. The first feedback system selects $M_1$ first resistance components and $N_1$ second resistance components so that a first combination of the $M_1$ first resistance components and the $N_1$ second resistance components substantially matches the impedance of a first resistor. The first feedback system selects $M_2$ first resistance components and $N_2$ second resistance components so that a second combination of the $M_2$ first resistance components and the $N_2$ second resistance components substantially matches the impedance of the first resistor. Based on the values of $M_1$, $N_1$, $M_2$, $N_2$, and a target impedance, the first feedback system generates a first set of calibration signals for a plurality of third resistance components and generates a second set of calibration signals for a plurality of fourth resistance components.

The advantage and spirit of the invention may be understood by the following recitations together with the appended drawings.

BRIEF DESCRIPTION OF THE APPENDED DRAWINGS

DETAILED DESCRIPTION OF THE INVENTION

One main purpose of this invention is to provide circuits and methods for calibrating resistance components.

Figure 1:
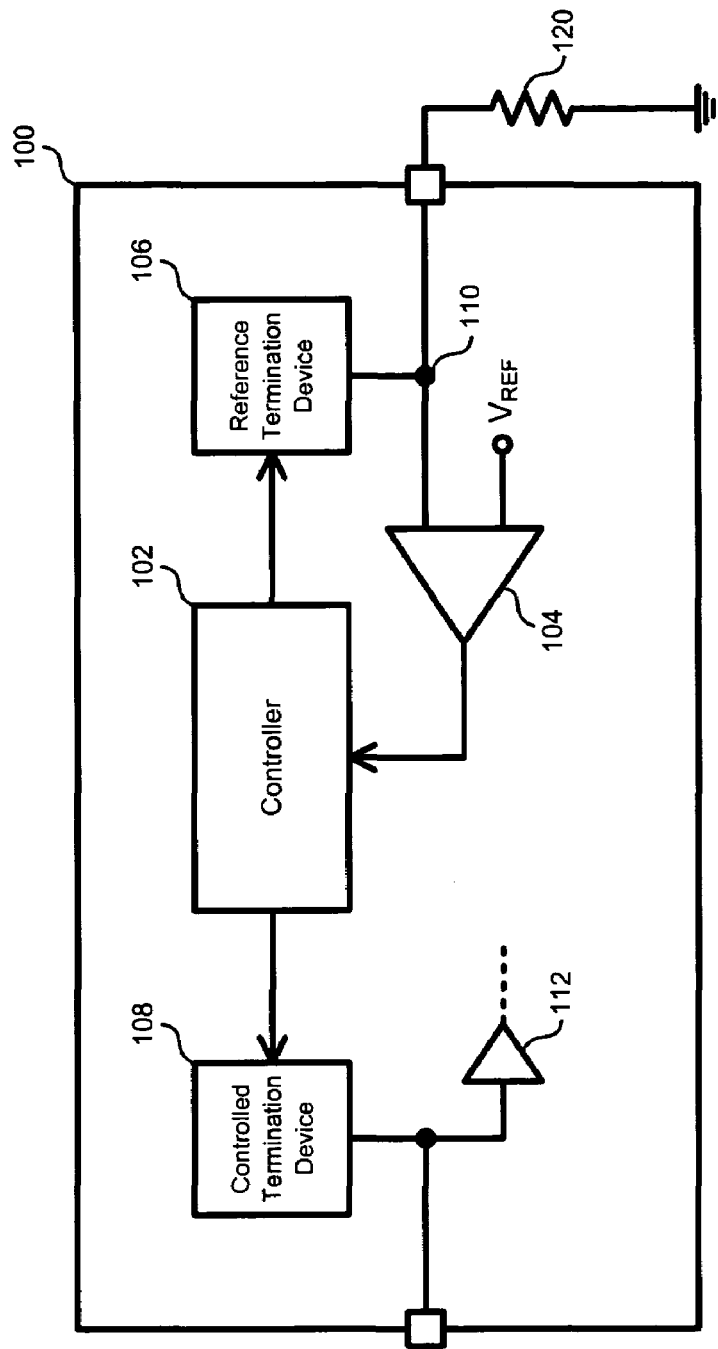
FIG. 1 illustrates a calibration circuit proposed in prior arts.
Figure 2:
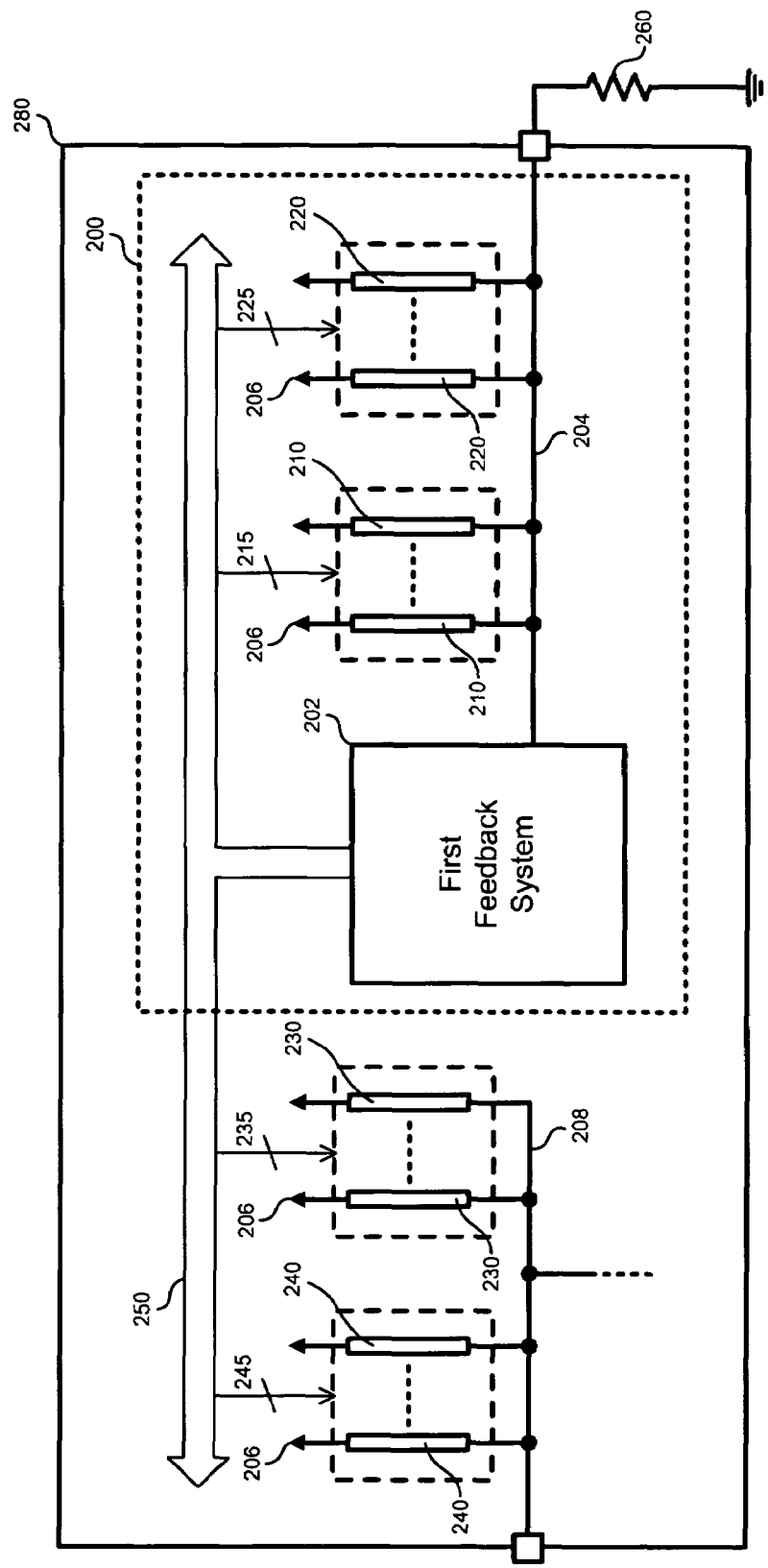
FIG. 2 illustrates the schematic diagram of a calibration circuit according to the first preferred embodiment of this invention.

Please refer to FIG. 2, which illustrates the schematic diagram of the calibration circuit 200 according to the first preferred embodiment of this invention. The calibration circuit 200 is fabricated in an integrated circuit 280 and includes a plurality of first resistance components 210, a plurality of second resistance components 220, and a first feedback system 202. The first resistance components 210 are nominally equivalent to each other in size. Each of the first resistance components 210 respectively has an impedance value equal to X. Similarly, the second resistance components 220 are nominally equivalent to each other in size. Each of the second resistance components 220 respectively has an impedance value equal to Y.

Figure 5:
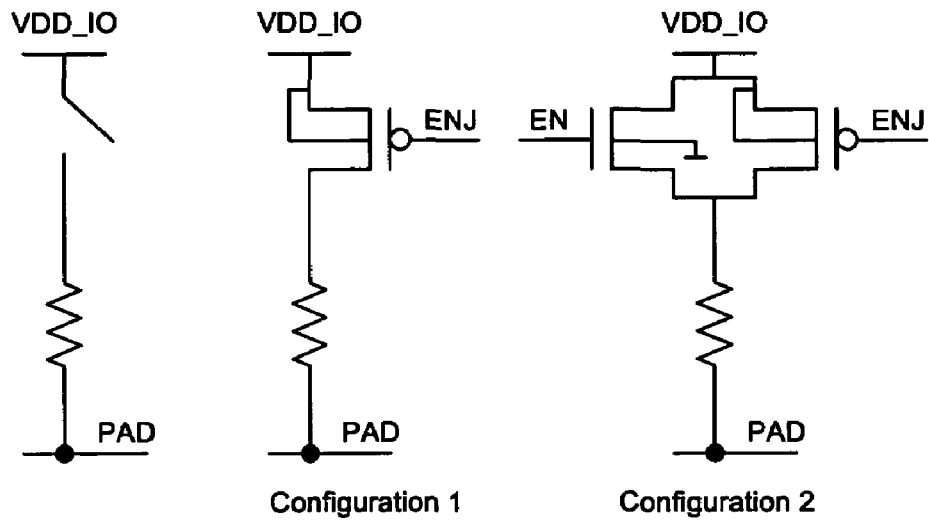
FIG. 5 illustrates schematic diagrams of transmission gates capable of forming a switch of a pull-up or a pull-down resistance component.
Figure 5:
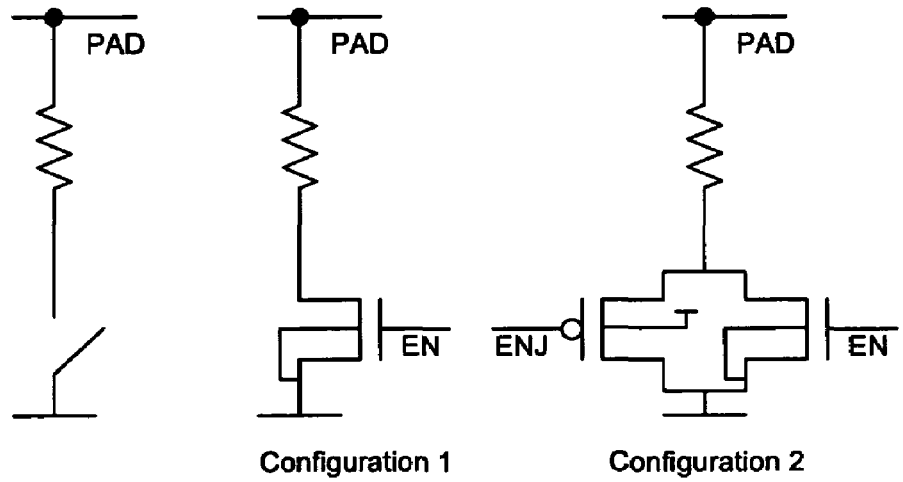

FIG. 5 depicts several possible circuit configurations for these resistance components. The first and second resistance components 210 and 220 could be conceptually configured as a switch along with a passive resistor. The switch could be simply a PMOS for a pull-up resistor or a NMOS for a pull-down resistor. The switch can also be a transmission gate for both pull-up and pull-down resistors. As long as the resistance components within the same group are identical to each other, the first and second resistance components 210 and 220 need not to be the same type of circuits.

By transmitting a first set of control signals 215 to the first resistance components 210 and transmitting a second set of control signals 225 to the second resistance components 220, the first feedback system 202 selects $M_1$ first resistance components 210 and $N_1$ second resistance components 220 so that a first combination of the $M_1$ first resistance components 210 and the $N_1$ second resistance components 220 substantially matches the impedance ($R_1$) of a first resistor 260. $M_1$ and $N_1$ are both natural numbers. The first set of control signals 215 and the second set of control signals 225 can be transmitted through a bus 250 shown in FIG. 2. The other first resistance components 210 and second resistance components 220 not selected by the control signals are usually disabled or set as open circuits.

Typically, the first resistor 260 is a chip resistor located on a PCB board and external to the integrated circuit 280. The first resistor 260 is coupled between node 204 and an external ground. In this illustrative embodiment, the first combination is connecting the $M_1$ first resistance components 210 and the $N_1$ second resistance components 220 in parallel. As shown in FIG. 2, the first resistance components 210 and the second resistance components 220 are respectively coupled between node 204 and node 206. It will be appreciated that other combinations can be used, and the present invention is not limited to this illustrative combination.

Figure 3:
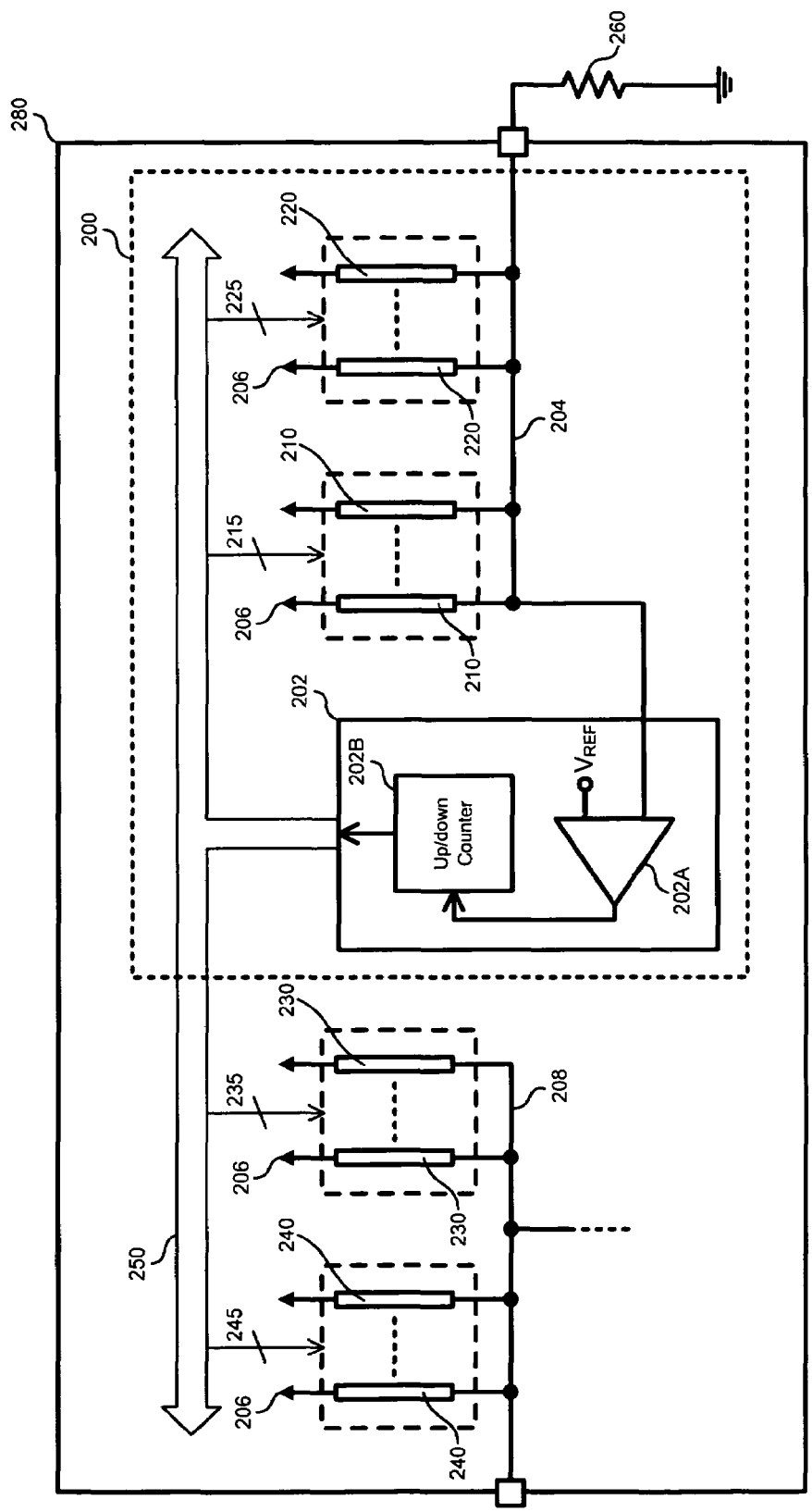
FIG. 3 illustrates a possible implementation of the first feedback system 202.

In actual applications, the first feedback system 202 can include a comparator 202A and an up/down counter 202B as shown in FIG. 3. The first resistance components 210 and the second resistance components 220 coupled to the first resistor 260 form a voltage divider. The divided voltage at node 204 is transmitted to one input terminal of the comparator 202A. The other input terminal of the comparator 202A is coupled to a reference voltage source ($V_{REF}$). In this way, the voltage at node 204 is compared to $V_{REF}$, which can be substantially set as one half a power supply voltage of the integrated circuit 280. The up/down counter 202B counts a output up and down according to the output of the comparator 202A. The output is provided to the first resistance components 210 and the second resistance components 220 as the first set of control signals 215 and the second set of control signals 225.

If the output of the comparator 202A indicates that the voltage at node 204 is higher than $V_{REF}$, then the up/down counter 202B generates a output that enables less first resistance components 210 or/and less second resistance components 220. On the contrary, if the output of the comparator 202A indicates that the voltage at node 204 is lower than $V_{REF}$, then the up/down counter 202B generates a output that enables more first resistance components 210 or/and more second resistance components 220. $M_1$ and $N_1$ are determined accordingly. By this feedback mechanism, the first combination of the $M_1$ first resistance components 210 and the $N_1$ second resistance components 220 is generated to substantially match the first resistor 260.

As described above, each of the first resistance components 210 respectively has an impedance value equal to X; each of the second resistance components 220 respectively has an impedance value equal to Y. As known by those skilled in the art, the impedance of the $M_1$ parallel first resistance components 210 is ($X/M_1$), and the impedance of the $N_1$ parallel second resistance components 220 is ($Y/N_1$). In this example, the aforementioned first combination can be represented as:

$$\left(\frac{X}{M_1}\right)\|\left(\frac{Y}{N_1}\right) = R_1, \quad \text{(Equation 1)}$$

wherein "||" represents a parallel calculation.

Subsequently, by changing the first set of control signals 215 and the second set of control signals 225, the first feedback system 202 re-selects $M_2$ first resistance components 210 and $N_2$ second resistance components 220 so that a second combination of the $M_2$ first resistance components 210 and the $N_2$ second resistance components 220 can also substantially match the impedance ($R_1$) of the first resistor 260. In this illustrative embodiment, the second combination is connecting the $M_2$ first resistance components 210 and the $N_2$ second resistance components 220 in parallel. $M_2$ and $N_2$ are also determined by the feedback mechanism. $M_2$ is a natural number different from $M_1$; $N_1$ is a natural number different from $N_2$. This second combination can be represented as:

$$\left(\frac{X}{M_2}\right)\|\left(\frac{Y}{N_2}\right) = R_1. \quad \text{(Equation 2)}$$

Since the values of $M_1$, $N_1$, $M_2$, $N_2$, and $R_1$ are known, X and Y can be calculated by solving Equations 1 and 2 in the first feedback system 202. Equation 1 and Equation 2 are minimum requirement to solve the two unknown variables. Involving more equations for solving the value of X and Y is allowed and preferable.

Assume a plurality of third resistance components 230 and a plurality of fourth resistance components 240 are going to be used for configuring a target impedance ($R_2$) between node 208 and node 206. According to this invention, every third resistance component 230 is nominally equivalent in size to one first resistance component 210. Similarly, every fourth resistance component 240 is nominally equivalent in size to one second resistance component 220. Thus, each of the third resistance components 230 respectively has an impedance value equal to X; each of the fourth resistance components 240 respectively has an impedance value equal to Y.

Based on X, Y and the target impedance ($R_2$), the first feedback system 202 generates a first set of calibration signals 235 for the third resistance components 230 and generates a second set of calibration signals 245 for the fourth resistance components 240. According to the first set of calibration signals 235, $M_3$ third resistance components 230 are enabled. According to the second set of calibration signals 245, $N_3$ fourth resistance components 240 are enabled. In this illustrative embodiment, the $M_3$ third resistance components 230 and the $N_3$ fourth resistance components 240 are coupled in parallel between node 208 and node 206.

$M_3$ and $N_3$ can be determined in the first feedback system 202 according to the following equation:

$$\left(\frac{X}{M_3}\right) \| \left(\frac{Y}{N_3}\right) = R_2. \quad \text{(Equation 3)}$$

In this equation, the value X, the value Y, and the target impedance $R_2$ are known. Besides, one of the two values, $M_3$ and $N_3$, can be pre-determined. Hence, the other non-determined value (either $N_3$ or $M_3$) could then be derived by Equation 3. By properly determining $M_3$ and $N_3$, the combination of the $M_3$ third resistance components and the $N_3$ fourth resistance components can substantially match the target impedance ($R_2$).

For any transceiver in the integrated circuit 280, this target impedance can equal to either a desired driver output resistance in an TX mode or a desired termination resistance in an RX mode. Because the target impedance ($R_2$) doesn't have to be the same as the impedance ($R_1$) of the first resistor 260, the calibration circuit 200 can provide various sets of calibration signals for plural termination resistances at the same time as long as X and Y are determined. That is to say, all the pull-up termination resistances can share the calibration circuit 200 even the required resistant values are different. Hence, only one calibration pin and one external resistor are needed for the integrated circuit 280.

In actual applications, the equation solver for solving Equation 1, Equation 2, and Equation 3 could be implemented as hardware (integrated circuits) or software (firmware calculations).

Although pull-up resistance components are taken as an example in the above paragraphs, pull-down resistance components can also be calibrated based on the aforementioned circuits. Furthermore, each of the resistance components can include transistors and/or resistors. A pull-up resistance component typically includes an PMOS (p-channel MOSFET) as a switch and a passive resistor in series, and a pull-down resistance component typically includes an NMOS (n-channel MOSFET) as a switch and a passive resistor in series. As depicted in FIG. 5, a transmission gate can form a switch of a pull-up or a pull-down resistance component.

Figure 4:
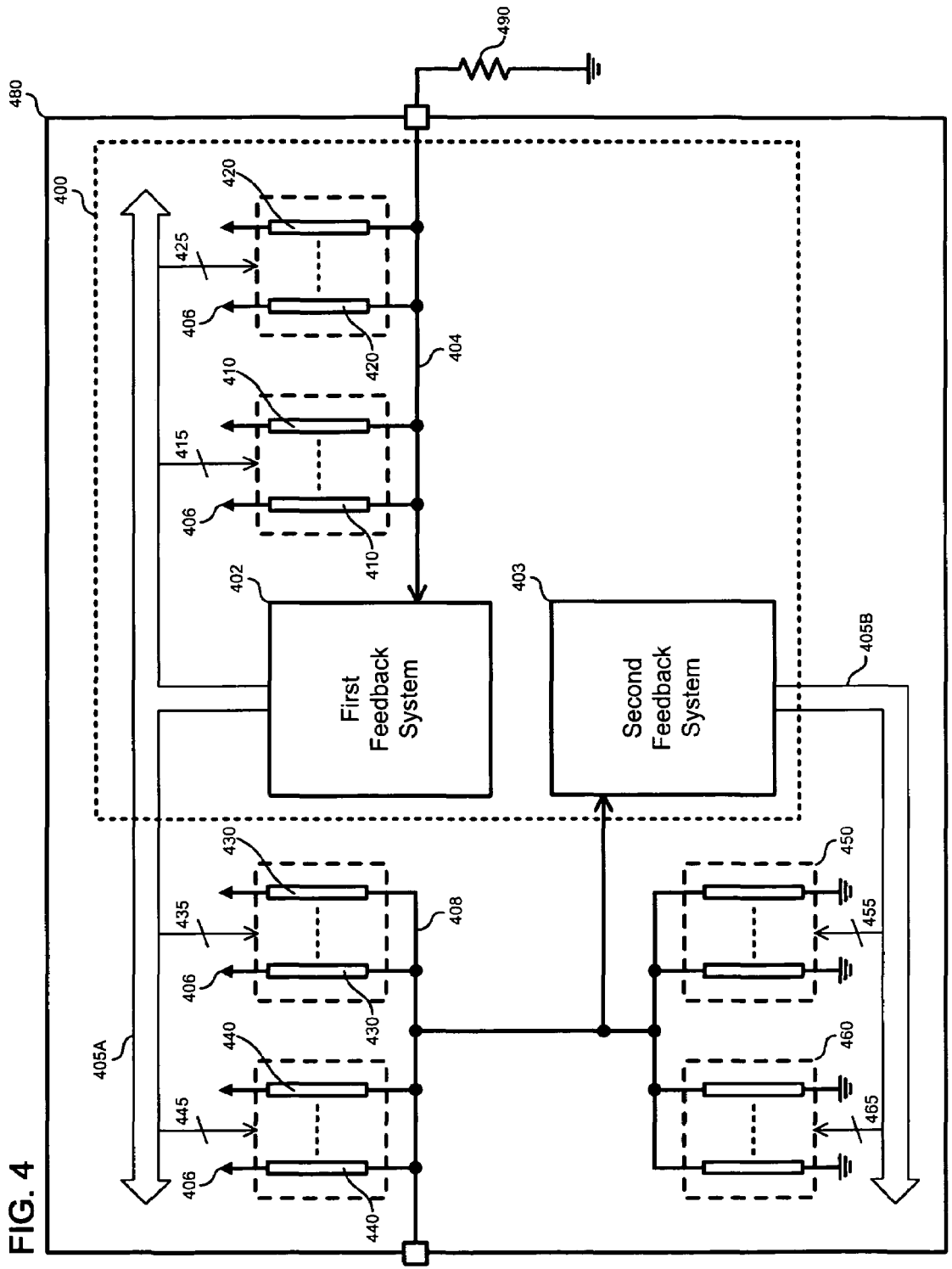
FIG. 4 illustrates the schematic diagram of a calibration circuit according to the second preferred embodiment of this invention.

Please refer to FIG. 4, which illustrates the schematic diagram of the calibration circuit 400 according to the second preferred embodiment of this invention. In this embodiment, the calibration circuit 400 further includes a second feedback system 403.

After the first feedback system 402 calibrates the third resistance components 430 and the fourth resistance components 440 (i.e. selects the $M_3$ third resistance components 430 and the $N_3$ fourth resistance components 440), the combination of the $M_3$ third resistance components 430 and the $N_3$ fourth resistance components 440 is considered as substantially matching the target impedance ($R_2$). Hence, the second feedback system 403 can further calibrates a plurality of fifth resistance components 450 and a plurality of sixth resistance components 460 based on the $M_3$ third resistance components 430 and the $N_3$ fourth resistance components 440.

As shown in FIG. 4, the third resistance components 430, the fourth resistance components 440, the fifth resistance components 450, and the sixth resistance components 460 form a voltage divider. The divided voltage at node 408 is transferred to the second feedback system 403. Based on the divided voltage at node 408, the second feedback system 403 generates a third set of calibration signals 455 for the fifth resistance components 450 and a fourth set of calibration signals 465 for the sixth resistance components 460. The third set of calibration signals 455 and the fourth set of calibration signals 465 can be transmitted through a second bus 405B. Thus, a fourth combination of the fifth resistance components 450 and the sixth resistance components 460 can substantially match the combination of the $M_3$ third resistance components and the $N_3$ fourth resistance components. Because the pull-up and pull-down resistance components in this embodiment can share the calibration circuit 400, only one calibration pin and one external resistor are needed for all the transceivers in the integrated circuit 480.

In another embodiment, the sizes of the first resistance components 210 are in accordance with a binary-weighted sequence. For instance, the impedance values of the first resistance components 210 can be X, $X/2^1$, $X/2^2$..., and $X/2^P$, respectively. Similarly, the impedance values of the second resistance components 220 can be Y, $Y/2^1$, $Y/2^2$..., and $Y/2^Q$, respectively. P is an integer larger than or equal to $M_1$ and $M_2$; Q is an integer larger than or equal to $N_1$ and $N_2$.

Correspondingly, the impedance of the $M_1$ parallel first resistance components 210 is equal to (X/x1), wherein x1 is an addition result of $M_1$ numbers selected from $\{2^0, 2^1, 2^2 ..., 2^P\}$; the selected $M_1$ numbers are corresponding to the $M_1$ first resistance components 210 in the first combination. Similarly, the impedance of the $N_1$ parallel second resistance components 220 is equal to (Y/y1), wherein y1 is an addition result of $N_1$ numbers selected from $\{2^0, 2^1, 2^2 ..., 2^Q\}$; the selected $N_1$ numbers are corresponding to the $N_1$ second resistance components 220 in the first combination.

In this example, the aforementioned first combination can be represented as:

$$(X/x1) \| (Y/y1) = R_1. \quad \text{(Equation 4)}$$

Likewise, the aforementioned second combination can be represented as:

$$(X/x2) \| (Y/y2) = R_1. \quad \text{(Equation 5)}$$

wherein x2 is an addition result of $M_2$ numbers selected from $\{2^0, 2^1, 2^2 ..., 2^P\}$; the selected $M_2$ numbers are corresponding to the $M_2$ first resistance components 210 in the second combination; y2 is an addition result of $N_2$ numbers selected from $\{2^0, 2^1, 2^2 ..., 2^Q\}$; the selected $N_2$ numbers are corresponding to the $N_2$ second resistance components 220 in the second combination.

Since the values of x1, y1, x2, y2, and $R_1$ are known, X and Y can be calculated by solving Equations 4 and 5 in the first feedback system 202. Subsequently, the first set of calibration signals for the third resistance components 230 and the second set of calibration signals for the fourth resistance components 240 can be generated as described in the embodiment above.

With the example and explanations above, the features and spirits of the invention are well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A calibration circuit, comprising:
   a plurality of first resistance components;
   a plurality of second resistance components; and
   a first feedback system for selecting $M_1$ first resistance components and $N_1$ second resistance components so that a first combination of the $M_1$ first resistance components and the $N_1$ second resistance components substantially matches the impedance ($R_1$) of a first resistor, the first feedback system selecting $M_2$ first resistance components and $N_2$ second resistance components so that a second combination of the $M_2$ first resistance components and the $N_2$ second resistance components substantially matches the impedance of the first resistor, $M_1$, $N_1$, $M_2$ and $N_2$ being natural numbers;
   wherein, based on the values of $M_1$, $N_1$, $M_2$, $N_2$, and a target impedance ($R_2$), the first feedback system generates a first set of calibration signals for a plurality of third resistance components and generates a second set of calibration signals for a plurality of fourth resistance components.

2. The calibration circuit of claim 1, wherein each of the first resistance components is nominally equivalent in size of each of the third resistance components, and each of the second resistance components is nominally equivalent in size of each of the fourth resistance components.

3. The calibration circuit of claim 1, wherein the first combination is connecting the $M_1$ first resistance components and the $N_1$ second resistance components in parallel, and the second combination is connecting the $M_2$ first resistance components and the $N_2$ second resistance components in parallel.

4. The calibration circuit of claim 3, wherein the first set of calibration signals selects $M_3$ third resistance components from the plurality of third resistance components, the second set of calibration signals selects $N_3$ fourth resistance components from the plurality of fourth resistance components, and a third combination of the $M_3$ third resistance components and the $N_3$ fourth resistance components substantially matches the target impedance ($R_2$).

5. The calibration circuit of claim 4, wherein the third combination is connecting the $M_3$ third resistance components and the $N_3$ fourth resistance components in parallel.

6. The calibration circuit of claim 5, wherein X represents the impedance of one of the first resistance components, Y represents the impedance of one of the second resistance components, and the first feedback system determines $M_3$ and the $N_3$ according to the following equation:

$$\begin{cases} \left(\frac{X}{M_1}\right) \| \left(\frac{Y}{N_1}\right) = R_1 \\ \left(\frac{X}{M_2}\right) \| \left(\frac{Y}{N_2}\right) = R_1 \\ \left(\frac{X}{M_3}\right) \| \left(\frac{Y}{N_3}\right) = R_2 \end{cases}$$

wherein "$\|$" represents a parallel calculation.

7. The calibration circuit of claim 1, wherein the first feedback system comprises:
   a voltage divider comprised of the plurality of first resistance components, the plurality of second resistance components, and the first resistor;
   a comparator for comparing a first divided voltage of the voltage divider with a reference voltage to produce a comparator output; and
   an up/down counter for counting a binary output up and down according to the comparator output, the binary output being provided to the plurality of first resistance components and the plurality of second resistance components.

8. The calibration circuit of claim 1, wherein each of the first resistance components and each of the second resistance components respectively comprises a transistor and a resistor.

9. The calibration circuit of claim 8, wherein the transistor is selectively a NMOS or a PMOS.

10. The calibration circuit of claim 1, the calibration circuit further comprising:
    a second feedback system for controlling a plurality of fifth resistance components and a plurality of sixth resistance components so that a fourth combination of the fifth resistance components and the sixth resistance components substantially matches a third combination of the third resistance components and the fourth resistance components.

11. The calibration circuit of claim 1, wherein the sizes of the plurality of the first and second resistance components are respectively in accordance with a binary-weighted sequence.

12. A method of generating a first set of calibration signals and a second set of calibration signals, comprising:
    selecting $M_1$ first resistance components from a plurality of first resistance components and $N_1$ second resistance components from a plurality of second resistance components so that a first combination of the $M_1$ first resistance components and the $N_1$ second resistance components substantially matches the impedance ($R_1$) of a first resistor, wherein $M_1$ and $N_1$ are natural numbers;
    selecting $M_2$ first resistance components from the plurality of first resistance components and $N_2$ second resistance components from the plurality of second resistance components so that a second combination of the $M_2$ first resistance components and the $N_2$ second resistance components substantially matches the impedance ($R_1$) of the first resistor, wherein $M_2$ and $N_2$ are natural numbers; and
    based on the values of $M_1$, $N_1$, $M_2$, $N_2$, and a target impedance ($R_2$), generating the first set of calibration signals for a plurality of third resistance components and generating the second set of calibration signals for a plurality of fourth resistance components.

13. The method of claim 12, wherein each of the first resistance components is nominally equivalent in size of each of the third resistance components, and each of second resistance components is nominally equivalent in size of each of the fourth resistance components.

14. The method of claim 12, wherein the first combination is connecting the $M_1$ first resistance components and the $N_1$ second resistance components in parallel, and the second combination is connecting the $M_2$ first resistance components and the $N_2$ second resistance components in parallel.

15. The method of claim 14, wherein the first set of calibration signals selects $M_3$ third resistance components from the plurality of third resistance components, the second set of calibration signals selects $N_3$ fourth resistance components from the plurality of fourth resistance components, and a third combination of the $M_3$ third resistance components and the $N_3$ fourth resistance components substantially matches the target impedance ($R_2$).

16. The method of claim 15, wherein the third combination is connecting the $M_3$ third resistance components and the $N_3$ fourth resistance components in parallel.

17. The method of claim 16, wherein X represents the impedance of one of the first resistance components, Y represents the impedance of one of the second resistance components, and $M_3$ and the $N_3$ are determined according to the following equation:

$$\begin{cases} \left(\frac{X}{M_1}\right) \| \left(\frac{Y}{N_1}\right) = R_1 \\ \left(\frac{X}{M_2}\right) \| \left(\frac{Y}{N_2}\right) = R_1 \\ \left(\frac{X}{M_3}\right) \| \left(\frac{Y}{N_3}\right) = R_2 \end{cases},$$

wherein "$\|$" represents a parallel calculation.

18. The method of claim 12, wherein each of the first resistance components and each of the second resistance components respectively comprises a transistor and a resistor.

19. The method of claim 18, wherein the transistor is selectively a NMOS or a PMOS.

20. The method of claim 12, the method further comprising:
controlling a plurality of fifth resistance components and a plurality of sixth resistance components so that a fourth combination of the fifth resistance components and the sixth resistance components substantially matches a third combination of the third resistance components and the fourth resistance components.

21. The method of claim 12, wherein the sizes of the plurality of the first and second resistance components are respectively in accordance with a binary-weighted sequence.

* * * * *